United States Patent [19]
Kilian et al.

[11] Patent Number: 5,622,750
[45] Date of Patent: Apr. 22, 1997

[54] AEROSOL PROCESS FOR THE MANUFACTURE OF PLANAR WAVEGUIDES

[75] Inventors: Arnd H. Kilian, Summit; John B. MacChesney, Lebanon, both of N.J.; Theodore F. Morse, Providence, R.I.

[73] Assignee: Lucent Technologies Inc., Murray Hill, N.J.

[21] Appl. No.: 331,460

[22] Filed: Oct. 31, 1994

[51] Int. Cl.$^6$ .................................. B05D 5/06; B05D 3/08
[52] U.S. Cl. .................. 427/163.2; 427/189; 427/10; 427/193; 427/223; 427/226; 427/376.2
[58] Field of Search ................................. 427/163.2, 223, 427/226, 189, 193, 376.2, 190

[56] References Cited

U.S. PATENT DOCUMENTS

| | | | |
|---|---|---|---|
| 3,873,339 | 3/1975 | Hudson | 427/163.2 |
| 3,883,336 | 5/1975 | Randall | 427/223 |
| 3,900,639 | 8/1975 | Lauterbach | 427/223 |
| 4,302,232 | 11/1981 | Schneider et al. | 427/163.2 |

*Primary Examiner*—Janyce Bell
*Attorney, Agent, or Firm*—Glen E. Books; Martin I. Finston

[57] ABSTRACT

A new method for the manufacture of glass films on substrates involves the flame reaction of an aerosol comprised of droplets of a solution containing all the precursors for the glass. A solution containing the precursors for all oxide components is atomized, and the resulting droplets are reacted in a flame to form spherical glass particles which are deposited on a heated substrate. By moving the substrate through the flame, a homogeneous deposit is achieved. Subsequent heat treatment in a furnace sinters the porous particle layer into a clear glass. The method has been successfully employed for the formation of sodium borosilicate glass films on silicon substrates and rare earth-doped multicomponent glass films for active devices.

13 Claims, 3 Drawing Sheets

AEROSOL PROCESS FOR THE MANUFACTURE OF PLANAR WAVEGUIDES

FIELD OF THE INVENTION

This invention pertains to planar optical waveguide devices and to an improved method using aerosols for making such devices.

BACKGROUND OF THE INVENTION

Glass is the most advantageous material for planar optical waveguides because of its excellent transparency, its high threshold to optical damage, and its ability to form uniform, homogeneous coatings of several μm in thickness. Its refractive index can be matched to that of optical fiber to minimize coupling losses. Glass possesses good chemical stability add durability and is mechanically rigid, a distinct advantage over waveguides in organic polymers. Furthermore, glass substrates are amorphous, making it is easier to produce polarization insensitive components. Last, not least, glasses are low cost.

A key step in the fabrication of planar optical waveguides is the formation of a glass layer on a substrate. Conventionally a waveguide device is fabricated by providing a substrate such as silicon, forming a first glass layer on the substrate to act as an undercladding, and forming on the first layer a second glass layer of a higher index to act as a core. The core layer is patterned into a desired waveguide configuration as by conventional photolithographic processes, and third layer of lower index glass is applied over the patterned core layer to act as an upper cladding. A wide variety of variations exist, but successive formations of glass layers on substrates is basic.

A number of different processes have been employed to form glass layers on substrates. The most important among them are ion exchange, chemical vapor deposition (CVD) and flame hydrolysis deposition (FHD). Other processes of lesser importance are sputtering and ion implantation. Glass films on substrates have also been formed by the sol-gel method.

The lowest losses in planar Waveguides have been achieved using either CVD or FHD in conjunction with reactive ion etching (RIE). Glasses made by this method have compositions and refractive indices similar to optical fiber. Using FHD together with RIE, multimode waveguides with core sizes of about 50 mm×50 mm as well as single-mode waveguides with core sizes of about 8 mm×8 mm have been produced. In the FHD process, layers of glass particles are generated by flame hydrolysis, using an oxygen/hydrogen torch. A mixture of different gaseous chlorides containing glass precursors, mainly $SiCl_4$, is fed into the torch. $TiCl_4$ or $GeCl_4$ are added to control the refractive index. Small amounts of $BCl_3$ and $POCL_3$ are added to the gas mixture to lower the consolidation temperature. The oxide particles are synthesized from the gaseous materials in the torch flame by hydrolysis and directly deposited onto the Si wafer. The wafer is moved through the flame by suitable means to achieve a homogeneous deposit of the soot. After deposition, the soot is consolidated into a clear glass layer by heating the wafer to 1300° C. in an electric furnace.

The use of multi-component glasses would have several additional advantages in planar waveguides. First, the thermal expansion coefficient of multi-component glass can be matched to silicon. The glasses typically produce by FHD have very low thermal expansion coefficients, much lower than silicon. Thus, after sintering the glass layer on top of the silicon is under high compressive stress, which has a tendency to warp the wafer and induce birefringence in the glass. Furthermore, the lower processing temperatures of multi-component glasses would be advantageous in integrating optical and electronic components on the same wafer. The heat sensitive electronic components on a wafer would have a much better chance to survive the optical waveguide fabrication process. Finally, such glasses may be more efficient for active devices such as waveguide lasers because higher concentrations of rare earth ions can be incorporated in these glasses without concentration quenching. Accordingly, there is a need for a new process for the fabrication of planar waveguides which avoids the requirement of gaseous precursors and will permit the deposition of rare earth doped multicomponent glasses.

SUMMARY OF THE INVENTION

A new method for the manufacture of glass films on substrates involves the flame reaction of an aerosol comprised of droplets of a solution containing all the precursors for the glass. A solution confining the precursors for all oxide components is atomized, and the resulting droplets are reacted in a flame to form spherical glass particles which are deposited on a heated substrate. By moving the substrate through the flame, a homogeneous deposit is achieved. Subsequent heat treatment in a furnace sinters the porous particle layer into a clear glass. The method has been successfully employed for the formation of sodium borosilicate glass films on silicon substrates and rare earth-doped multicomponent glass films for active devices.

BRIEF DESCRIPTION OF THE DRAWINGS

The advantages, nature and, various additional features of the invention will appear more fully upon consideration of the illustrative embodiments now to be described in detail in connection with the accompanying drawings. In the drawings.

It is to be understood that these drawings are for purposes of illustrating the concepts of the invention and are not to scale.

DETAILED DESCRIPTION

Figure 1:
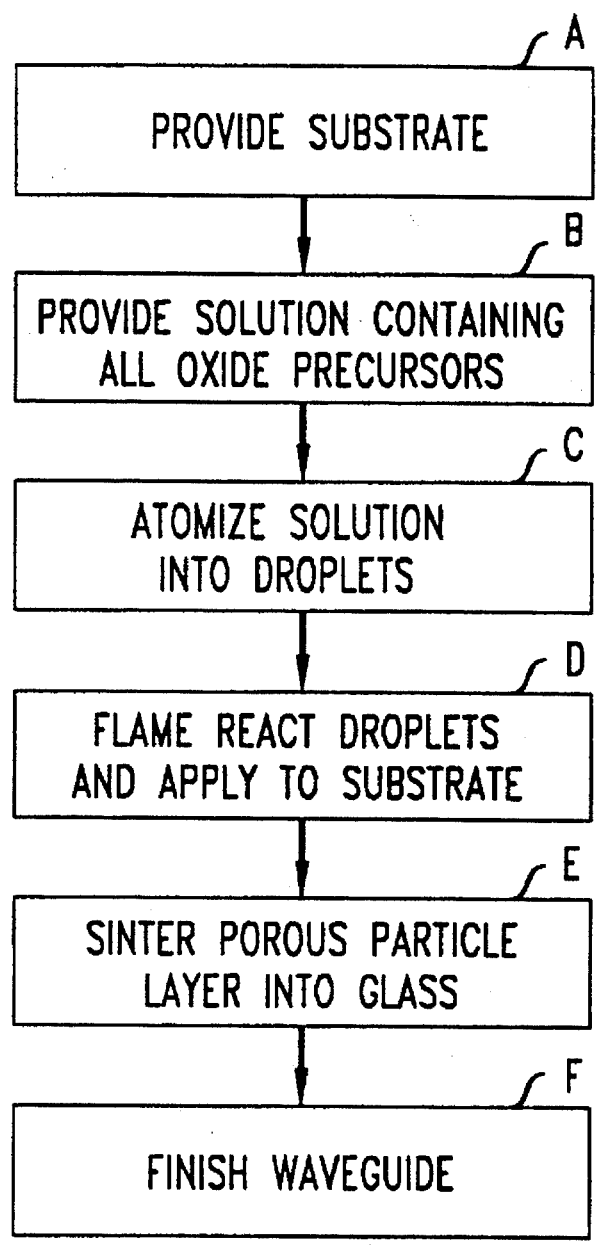
FIG. 1 is a flow diagram of an improved process for making optical planar waveguides.

Referring to the drawings, FIG. 1 is a schematic flow diagram of a preferred process for forming glass layers on substrates especially useful for making planar waveguides. An initial step, shown in block A, is to provide a substrate. In general, the substrate can be any convenient material compatible with glass films such as glass, ceramic or semiconductor. Preferably the substrate is silicon or silicon including one or more prior formed layers of glass on its surface.

When silicon substrates are to be used, as preliminary steps, the substrates are advantageously carefully cleaned and a thin layer of oxide is formed on the surface to be coated with glass. The preferred cleaning process is performed within a clean room using standard semiconductor industry procedure. The silicon wafers are subjected to a 15 minute bath in kerous acid followed by a 5 minute bath in an 80° C. mixture of 1 part ammonium hydroxide, one part hydrogen peroxide and four parts water. They are then subjected to a 1 minute etch in buffered hydrofluoric acid. Before and after each step, the wafers were thoroughly flushed with water and dried with filtered nitrogen gas.

In using silicon substrates it is advantageous to preoxidize the wafers in order to minimize the surface tension difference between the silicon and the deposited glass and to protect the substrate from reaction with glass constituents. The presence of oxide reduces beading Of glass on the surface and reduces the tendency toward crystalline growth. Preoxidation was achieved by heating the wafers in an $H_2O/O_2$ atmosphere to 1100° C. for 13 hours. The resulting oxide layer was about 1 μm thick.

Ceramic substrates, in contrast to silicon, can be more easily cleaned. It is nonetheless desirable to heat them in an oxygen ambient to burn out any organic residues. Polycrystalline alumina substrates, for example, were cleaned by washes in acetone and soap solution, followed by beating to 900° C. in an $O_2$ atmosphere for 12 hours. Glass-coated silicon and ceramic substrates generally need only be cleaned.

Another initial step shown in block B of FIG. 1 is to provide a solution containing the precursors for the desired glass. In developing precursor solutions, it must be remembered that the solution is being prepared for flame deposition. As the liquid precursor droplets enter the flame, more volatile precursor compounds will have a tendency to evaporate from the droplets and to react from the gas phase. The remainder of the droplet then reacts at a different location in the flame leading to the formation of particles of a different composition. An approach was sought to reduce the volatility of all the precursors. Silicon and boron alkoxides are not miscible with water, but the methoxides and ethoxides mix well with alcohol/water mixtures. For this mason, and also because of the high speed of hydrolysis, tetramethoxysilane (TMOS) was used as the precursor for silicon. Results with the methoxy analog of boron were not as good, hydrolyzation speed was so high that a precipitate was formed, which did notredissolve. Because of this tripropyl borate was used. For the elements with more ionic character, theirs nitrates were used as precursors. The procedure was to dissolve the nitrates, e.g. aluminum and sodium nitrate together with some acid in the appropriate amount of water, and then to add under vigorous stirring the TMOS together with the tripropyl borate in a mixture with methanol. The solution warms slightly while the two phases mix, and after approximately one minute of stirring a clear, homogeneous solution results. Under these conditions the alkoxides are hydrolyzed quickly to fort, a multitude of mixed alkoxide/hydroxide species, which in addition may undergo condensation. To assure complete hydrolysis, the solutions were stirred for at least 15 minutes before they were introduced into the atomizer. The procedure resembles the beginning stage of the sol gel process and a considerable amount of research has been done to characterize the chemical reactions that occur. The acid serves as a catalyst to speed up the hydrolyzation and also slows down the condensation preventing gelling from occurring too quickly. The reaction for TEOS was monitored using Si nuclear magnetic resonance and the following equilibrium was found to exist:

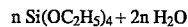

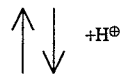

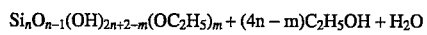

A similar equilibrium can be expected for TMOS. Even after days, the Si species were shown to consist mainly of dimers and trimers. Boric acid, which is the result of the total hydrolysis of the boron alkoxide, is more soluble in water than silicic acid. Presumably, this result in a larger amount of replaced alkoxide groups, i.e. m in the reaction

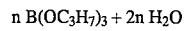

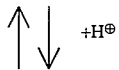

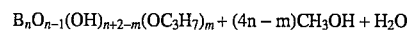

is probably smaller than in the case of the, silicon analog. The reactions shown above can also occur between the different alkoxides to form mixed species of the kind $Si_nB_1O_{n+1-1}(OH)_{2n+1+2-m}(OCH_3)_m$, leading of the mixture of the different oxides on a molecular level. The solution containing these species plus the nitrates is prepared.

The next step, shown in block C of FIG. 1, is to atomize the solution containing the glass precursors to form an aerosol of droplets each containing in a nonvolatile form all the precursors for the oxides in the final glass. This can be accomplished in a conventional commercial atomizer. Care should be taken to avoid running the atomizer for an extended period of time without adding fresh solution. Otherwise evaporation of water can concentrate the solution beyond the solubility limit. By feeding fresh solution into the atomizer to keep the liquid level constant, precipitation of solutes can be easily avoided.

As shown in block D, after atomization, the aerosol droplets are flame reacted to produce glass particles which are deposited on the substrate. Upon heating the droplets in a torch flame, the volatile components, i.e. the methanol, water and some propanol all evaporate. During this evaporation the viscosity in the droplets increases rapidly.

While not necessary for the invention, the following constitutes applicants' best understanding of what happens during flame reaction. Simultaneously, the organic components and the water evaporate. Upon further heating the nitrates decompose. Finally, the resulting porous particles sinter into solid glass spheres. By choosing the precursors appropriately, the evaporation of any precursor material from the droplet is avoided; and the molar fractions of each of the precursors in each particle is the same. The chemical reactions can be summarized as follows:

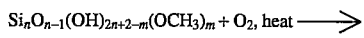

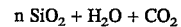

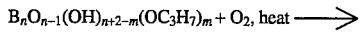

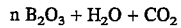

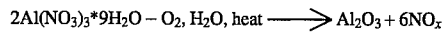

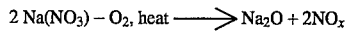

Using their alkoxides, it also has been possible to add titanium, tantalum and germanium to the precursor solution with the intent to raise the refractive index of the glass films. Like boron and silicon, these elements do not form soluble inorganic salts. The respective precursors, i.e. titanium propoxide, germanium ethoxide and a mixture of tantalum ethoxide and germanium ethoxide were added to the alcohol/TMOS/boron propoxide mixture. Adding this to the acidic nitrate solution produced a clear solution similar in appearance to the original solution without these additional elements. By careful control of the hydrolysis, it is expected that any oxide glass can be produced with this type of solution. All the elements that have been included in oxide glasses either form soluble nitrates or alkoxides that can be added to the solution as described above.

Figure 2:
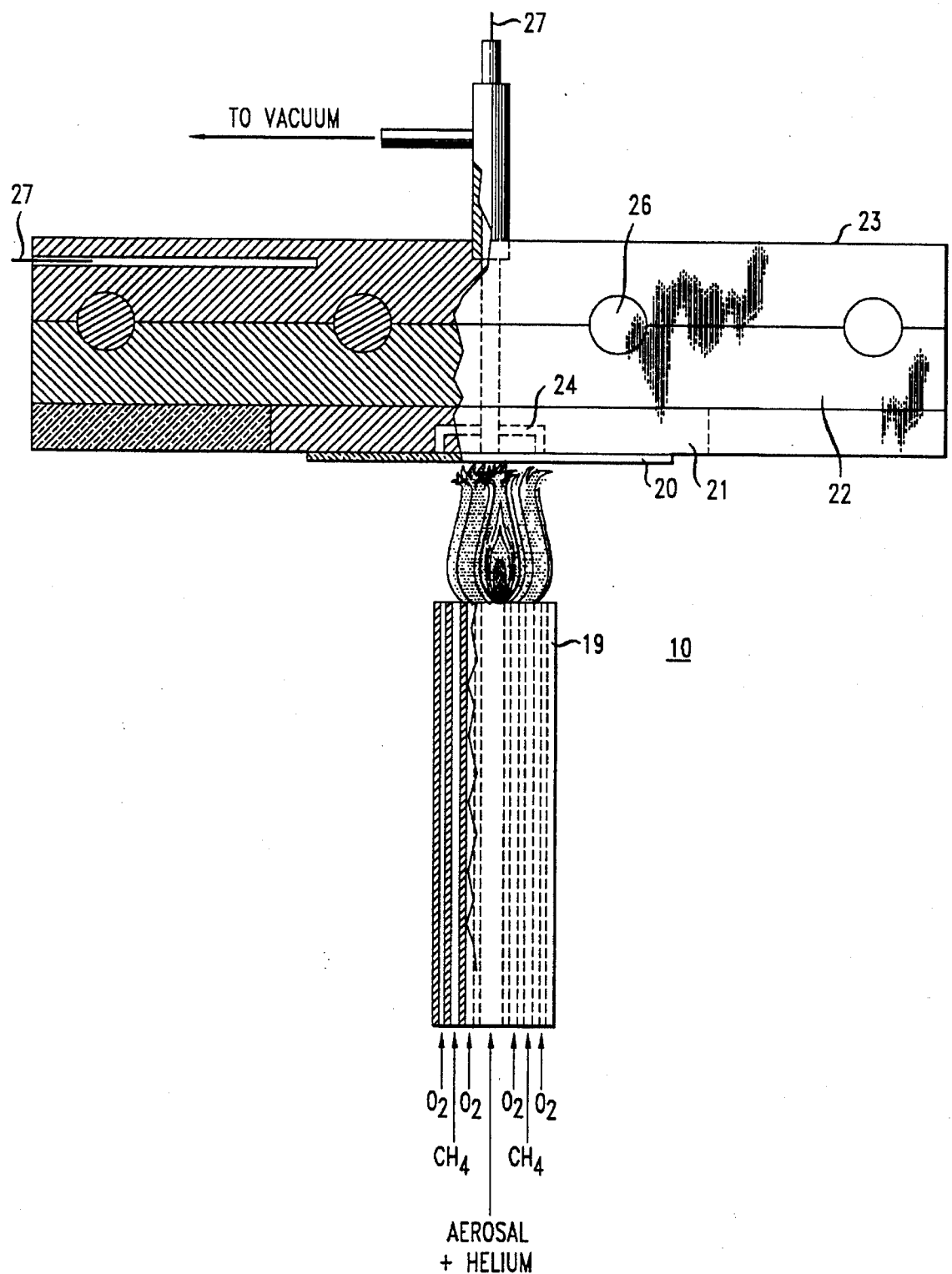
FIG. 2 is a side view of a deposition torch useful in practicing the method of FIG. 1.

The step of flame reaction and application of the resulting particles to the substrate may be better understood by reference to FIG. 2 which is a schematic side view of the torch 10 applying particles to a substrate 20. In essence, the torch consists of a tube array 18 of concentric quartz tubes fused together at one end to form concentric, annular gas outlets at the other end. The outermost ring carries oxygen, the next inner supplies methane, and the next inner ring again carries oxygen. The aerosol of solution droplets is supplied by the central robe. The ring surrounding the central tube provides a gap between the aerosol and the hot combustion gases. In operation, the hot combustion gases surround the aerosol, thermophoretically entraining the particles and directing them at a target.

Advantageously, a shroud in the form of a quartz tube 19 slides over the array 18. The shroud protects the reaction zone from external air currents, stabilizing the flame. Preferably in operation, the torch is mounted vertically, pointing upwards, in order to minimize disturbances on the flame by buoyancy effects. The combustion gases and the aerosol are preferably supplied from the bottom of the torch.

The target wafer 20 is preferably mounted on a heatable vacuum holder comprising a perforated copper block 21 disposed on a pair of larger aluminum plates 22 and 23. The perforations 24 in copper block 21 are connected to a vacuum pump (not shown) by passages 25. Heating rods 26 are advantageously held in grooves between plates 22 and 23. The metal plates are tightly held together to assure uniform heat transfer. A thermocouple 27 is inserted into a bore in the aluminum plate to provide a temperature signal to a thermal controller (not shown) for temperature regulation.

One objective of this holder is to preheat the wafer before application of the torch flame. This preheating contributes to the quality of the deposited film, with a temperature of about 200° C. optimal.

Figure 3:
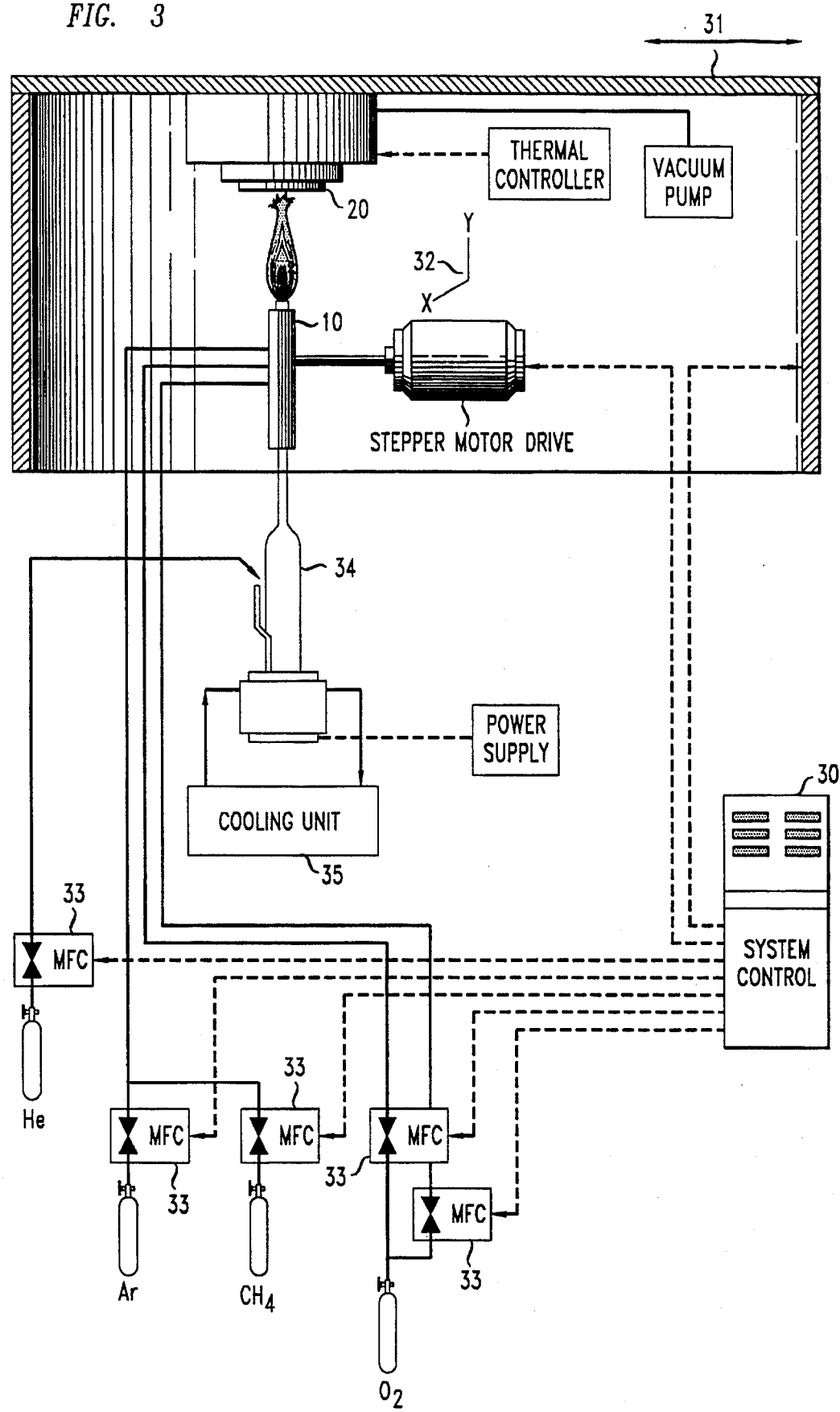
FIG. 3 is a schematic view of apparatus for using the torch of FIG. 2 in the process of FIG. 1.

FIG. 3 schematically illustrates apparatus for using the torch of FIG. 2 in the process of FIG. 1. In essence relative motion between the torch and substrate is controlled to deposit a uniform layer of particles on the substrate. The relative motion of the torch 10 and substrate mounting 20 as well as the flow of gases are programmable via a system controller 30 operating on a glass-working lathe 31, the drive motors of a torch translational stage 32 and gas valves 33. Advantageously, the aerosol unit 34 is provided with a cooling unit 35.

It was found desirable to match the velocities of the gases in the torch. Otherwise disturbances were induced in the flowfield in front of the torch, where the gases mix after leaving the torch, leading to the collection of carbonaceous material on the face of the torch. This is easily avoided by careful control of all the flow rates to match the gas velocities. However, since the flow rate of methane has to be low to achieve the necessary low flame temperatures, additional argon had to be mixed with the methane to increase the gas flow rate through the methane supply ring of the torch. All gases flow rates are monitored and controlled using flow controllers, i.e. a methane-, two oxygen-, an argon flowmeter and a helium flowmeter were needed.

Advantageously, the entire mounting assembly 20 is mounted on a rack which is attached to the head and tailstock carriage of glass-working lathe 31. This allows the transverse movement of the assembly in a first direction (x-direction) passing the wafer through the torch flame. The velocity of this movement and the end points are adjusted by the lathe control unit. The torch holder is mounted to a y, z translational stage 32 driven by stepper motors. This stage permits precise positioning of the torch relative to the wafer. Conveniently, the stepper motor control for the y-direction is triggered by an end switch each time the lathe carriage reaches one end of the x-directional movement. In this manner the torch moves across the entire surface of the wafer laying down, homogeneous deposit.

The preferred operation of this system follows. After the solution is prepared and introduced into the atomizer, the cooling recirculation bath is started. We found a cooling water temperature of 12° C. yielded the optimum performance for the solutions described hereinabove. The atomizer is connected to the torch with a flexible hose. Typically, the atomizer is already started at this point to stabilize the amount of aerosol generated. Using the vacuum system the wafer is attached to the assembly, which has been previously brought up to temperature. A holder consisting of a watch glass with an attached handle is used to position the wafer on the assembly, then the vacuum line is opened and the wafer attaches to the unit. In oxide glass, crystallization is catalyzed by the, presence of water and the resulting formation of OH-groups. Since water is abundant in the flame from the combustion of the hydrocarbons and the evaporation of the aerosol, the temperature of deposited soot has to be kept below the transition temperature of the glass. This can be taken as a measure for the lowest temperature at which crystallization could occur. Furthermore, the soot has to be "dried" before being sintered, that is, the OH-groups in the glass have to be removed, otherwise they promote crystallization during the sintering process. A lower density of the soot is expected to result in a higher porosity, which in turn promotes the diffusion of the gases used for the removal of the OH groups. Thus, another reason for depositing at a lower temperature is to avoid presintering of the soot layer leading to low soot porosity. A distance of 20 mm between the wafer and the upper end of the shroud proved to be a good compromise between stabilizing the flame and avoiding the overheating of the deposited soot. Typical gas flow rates are as follows:

Oxygen (outer ring): 5 slm (Standard liter/min.)

Oxygen (inner ring): 5 slm

Methane (ring in-between): 5 slm

Argon (ring in-between): 5 slm

Helium (carrier gas, center): 5 slm

The deposition procedure is straightforward. The flow rates of methane, oxygen, argon and the carrier gas helium are set on the system control panel. The methane is switched on, and the flame is ignited. Then, the other gas flows are started one by one. The helium flow, which carries the aerosol to the flame, is started last. The moving speed of the chucks of the glass-working lathe (which causes the wafer to move through the flame from left to right and vice versa) is adjusted at the system control unit. 15 mm/s was found to be a suitable speed. Each time after the lathe chucks trips the switch at their left end position, the torch is moved (from the back to the front of the wafer and vice versa) by the stepper motor by 2.6 mm. Both this value and the speed of the lathe chuck are chosen somewhat arbitrarily. No difference in the deposit was found when either one of the values was changed. Currently in most of the experiments the torch is passed eight times across the entire surface of the wafer, which takes approximately one hour. After that, the entire arrangement is shut down in the reverse order of the start up procedure. Before the wafer is taken of the assembly, any soot is removed from its edge with the help of a syringe needle connected to a vacuum pump. Otherwise flakes of soot were formed during the procedure of transferring the wafer from the deposition arrangement to the sintering furnace. Some of these flakes might end up on the wafer and destroy the uniformity of the deposited layer.

The next step shown in block E of FIG. 1 is to sinter the particle layer into homogeneous glass. After deposition, the wafer is removed from the holding assembly and transferred into a quartz tube furnace for further treatment. A metered gas supply for helium and oxygen is connected to the furnace tube to allow for the control of the atmosphere during the heat treatment. The quartz tube is sealed with removable caps at both ends. One of them contains a bore through which a handle can be inserted to move the boat for the wafers in and out of the hot zone while the furnace tube remains sealed. This assures the exclusion of ambient moisture from the furnace atmosphere during periods when the wafers are hot, a measure which was found important to prevent crystallization in the deposited glass layers. The furnace is sealed while the wafer with the quartz boat still rests in a cold section of the furnace tube. Only after the tube has been sufficiently purged, the boat is pushed with a handle reaching through a bore in the endcap into the hot zone of the furnace. In this way, exposure of the soot to ambient moisture at high temperature is avoided. The sintering atmosphere consists of $O_2$/He. Both gases are metered using flowmeters and needle valves, after that they are passed through a phosphorous pentoxide drying column to assure minimum moisture levels. Several different sintering schedules were tested. It was found that a lower temperature treatment (typically at 500° C.) in pure $O_2$ to remove OH-groups is desirable. Only after this "drying" procedure can the temperature be raised to the temperature where sintering yields consolidated soot. Otherwise the OH-groups are entrapped in the glass, leading to crystallization in case of the PYREX type glasses. In case of the rare earth oxide—$Al_2O_3$—$SiO_2$ the amount of the OH-groups was so large at sintering of 1000° C., that the material foamed. Presumably, the thermal stability of AlOOH led to a large amount of remaining OH, even when the temperature was slowly raised to 800° C. within 12 hours, the glass still foamed when heated to 1100° C. The "drying" treatment could be greatly improved by adding $Cl_2$ to remove OH as HCl.

Sintering was performed both in mixed He/$O_2$ atmospheres in varying ratios. Generally, He is preferred, because its greater diffusivity lead to improved sintering behavior especially in the final stages of the sintering process, when the pores are already closed. In the case of the sodium borosilicate glasses an $O_2$ atmosphere is advantageous. We speculate that eventually remaining OH-groups are removed by the $O_2$ at the sintering temperature. Sintering was performed at 930° C., 950° C., and 980° C. in pure $O_2$ for four hours, gradual improvement of the surface with increasing temperature was observed.

Typically, for a film deposited under the conditions described, a glass layer thickness of approximately 9 μm results. When the helium flow rate was varied, the results were:

| He flow rate [sl/min.] | 0.29 | 0.58 | 1.16 |
|---|---|---|---|
| Film thickness [μm] | 9.0 | 12.5 | 15.5 |

Since no other differences were found when comparing the films, it was decided to use the higher carrier gas flow rates to accelerate the deposition.

The solution components and process parameters for a cladding layer and three different core layers is set forth in Table 1 below:

TABLE 1

| Substrate | BASE LAYER, lower n (cladding) steam oxidized Silicon | CORE LAYER, Germanium and Erbium added steam oxidized Silicon | CORE LAYER, Germanium added steam oxidized Silicon | CORE LAYER, Gennardum and Tantalum added steam oxidized Silicon |
|---|---|---|---|---|
| $VCH_4$ [sl/m] | 0.36 | 0.36 | 0.36 | 0.36 |
| $V_{Ar}$ [sl/m] | 1.00 | 1.00 | 1.00 | 1.00 |
| $VO_2$ OuterRing [sl/m] | 3.40 | 3.40 | 3.40 | 3.40 |
| $VO_2$ InnerRing [sl/m] | 0.10 | 0.10 | 0.10 | 0.10 |
| $V_{He}$ [sl/m] | 0.29 | 0.29 | 0.29 | 0.29 |
| $T_{heater}$ [°C.] | 200 | 200 | 200 | 200 |
| $T_{wafer,backside}$ [°C.] | 210 | 210 | 210 | 210 |
| distance$_{WT}$ [cm] | 2.0 | 2.0 | 2.0 | 2.0 |
| $V_X$(Lathe) [mm/s] | 15.0 | 15.0 | 15.0 | 15.0 |
| $V_Y$(Stepper) [cm/move] | 2.6 | 2.6 | 2.6 | 2.6 |
| number of layers | 8 | 8 | 8 | 8 |
| Solution | [g] (M %) | [g] (M %) | [g] (M %) | [g] (M %) |
| $NaNO_3$ | 0.35 (7.7) | 0.31 (7.7) | 0.35 (7.7) | 0.35 (7.7) |
| $Al(NO_3)_3*9H_2O$ | 1.23 (6.2) | 1.23 (6.2) | 1.23 (6.2) | 1.23 (6.2) |
| TMOS | 2.90 (71.9) | 2.53 (63.0) | 2.53 (63.0) | 2.53 (63.0) |
| $B(OC_3H_7)_3$ | 1.42 (14.3) | 1.42 (14.3 | 1.42 (14.3) | 1.42 (14.3) |
| $Ge(OC_2H_5)_3$ | 0.61 (9.0) | 0.61 (9.0) | 0.47 (7.0) | |
| $Ta(OC_2H_5)_5$ | | | | 0.40 (1.9) |
| $Er(NO_3)_3*5H_2O$ | | 0.29 (1.0) | | |
| $H_2O$ [g] | 15.0 | 15.0 | | 15.0 |
| MeOH [g] | 3.00 | 3.00 | | 3.00 |
| $HNO_3$ [g] | 0.33 | 0.33 | | 0.33 |
| Drying and Sintering | 1 h at 500° C. 4 h at 980° C. all in pure $O_2$ | same | same | same |
| refractive index (at 632 nm) | 1.478 | | | |

The final step shown in block F is to finish the waveguide. This means that if the deposited layer is lower cladding, then a core layer should be formed on the cladding, the core layer is patterned into a waveguide configuration and upper cladding is applied. The method of FIG. 1, steps A–E can be used to form the core layer on the cladding or other known methods can be used to form the core layer. Similarly, the lower cladding layer can be made by conventional techniques and—using the glass-coated workpiece as the substrate—a core layer can be applied using steps A–E of FIG. 1. So the method of FIG. 1 can be used to apply any one or more of the layers used in making a planar waveguide device.

We claim:

1. A method for making a planar optical waveguide device comprising the steps of:

providing a substrate;

forming an aerosol comprising liquid droplets of a solution containing all elements contained in a glass to be formed;

reacting said droplets by passing them through a flame to form particles of said glass;

depositing said particles on said substrate to form a particulate layer;

sintering said particulate layer to form a continuous layer; and finishing said waveguide device.

2. The method of claim 1 wherein said substrate comprises silicon.

3. The method of claim 1 wherein said substrate comprises silicon having a surface layer of silicon oxide.

4. The method of claim 1 wherein said substrate comprises silicon having a surface layer of glass.

5. The method of claim 1 wherein said substrate comprises a ceramic material.

6. The method of claim 1 wherein said substrate comprises a ceramic material having a surface layer of glass.

7. The method of claim 1 wherein said solution comprises tetramethoxysilane.

8. The method of claim 1 wherein said solution comprises tripropyl borate.

9. The method of claim 1 wherein said solution comprises aluminum nitrate.

10. The method of claim 1 wherein said solution comprises sodium nitrate.

11. The method of claim 1 wherein said solution comprises a rare earth nitrate.

12. The method of claim 1 wherein said glass is a sodium borosilicate.

13. The method of claim 1 wherein said glass is a rare earth doped multicomponent glass.

* * * * *

UNITED STATES PATENT AND TRADEMARK OFFICE
CERTIFICATE OF CORRECTION

PATENT NO. : 5,622750
DATED       : April 22, 1997
INVENTOR(S) : Arnd H. Kilian, John B. MacChesney, Theodore F. Morse It is certified that error appears in the above-identified patent and that said Letters Patent is hereby corrected as shown below:

On the title page: Item [73] Assignee: should read -- Lucent Technologies Inc.  Part Interest     and "Brown University"  Part Interest Signed and Sealed this Twenty-third Day of May, 2000

Attest:

Q. TODD DICKINSON

*Attesting Officer*  *Director of Patents and Trademarks*